United States Patent
Mizoguchi

(10) Patent No.: US 9,461,611 B2
(45) Date of Patent: Oct. 4, 2016

(54) LOW PASS FILTER HAVING ATTENUATION POLE AND WAVE SPLITTER

(71) Applicant: Murata Manufacturing Co., Ltd., Nagaokakyo-shi, Kyoto-fu (JP)

(72) Inventor: Naoki Mizoguchi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 149 days.

(21) Appl. No.: 14/450,331

(22) Filed: Aug. 4, 2014

(65) Prior Publication Data

US 2015/0091669 A1    Apr. 2, 2015

(30) Foreign Application Priority Data

Sep. 27, 2013  (JP) ................. 2013-202215
Feb. 6, 2014   (JP) ................. 2014-021079

(51) Int. Cl.
    *H03H 7/46*   (2006.01)
    *H03H 7/01*   (2006.01)
    *H03H 1/00*   (2006.01)

(52) U.S. Cl.
    CPC ............ *H03H 7/1766* (2013.01); *H03H 7/46* (2013.01); *H03H 7/0115* (2013.01); *H03H 7/1758* (2013.01); *H03H 7/1775* (2013.01); *H03H 2001/0085* (2013.01)

(58) Field of Classification Search
    CPC .... H03H 7/46; H03H 7/1766; H03H 7/1758; H03H 7/1775; H03H 7/0115; H03H 2001/0085
    USPC ......................................................... 333/132
    See application file for complete search history.

(56) References Cited

U.S. PATENT DOCUMENTS

| | | | |
|---|---|---|---|
| 5,006,953 A * | 4/1991 | Hirama | H01G 4/242 361/309 |
| 6,737,935 B1 | 5/2004 | Shafer | |
| 2004/0235445 A1* | 11/2004 | Gomez | H04B 1/30 455/307 |
| 2009/0128260 A1 | 5/2009 | Block et al. | |
| 2010/0033267 A1 | 2/2010 | Mizutani et al. | |
| 2012/0212305 A1 | 8/2012 | Shafer | |
| 2012/0256701 A1 | 10/2012 | Solski et al. | |

FOREIGN PATENT DOCUMENTS

| | | |
|---|---|---|
| JP | 6-176966 A | 6/1994 |
| JP | 7-221580 A | 8/1995 |
| JP | 11-46096 A | 2/1999 |
| JP | 2005-303418 A | 10/2005 |

(Continued)

OTHER PUBLICATIONS

Official Communication issued in corresponding Japanese Patent Application No. 2014-021079, mailed on Dec. 1, 2015.

(Continued)

*Primary Examiner* — Robert Pascal
*Assistant Examiner* — Kimberly Glenn
(74) *Attorney, Agent, or Firm* — Keating & Bennett, LLP

(57) ABSTRACT

A low pass filter having an attenuation pole includes at least inductors disposed on a series arm which connects an input terminal and an output terminal. The inductors are wound inductors mounted on a first surface of a multilayer body. A winding axis of one of the wound inductors is perpendicular or substantially perpendicular to a winding axis of the other one of the wound inductors.

20 Claims, 10 Drawing Sheets

(56) References Cited

FOREIGN PATENT DOCUMENTS

| | | |
|---|---|---|
| JP | 2008-236024 A | 10/2008 |
| JP | 2009-538005 A | 10/2009 |
| JP | 2010-232765 A | 10/2010 |
| JP | 2011-19004 A | 1/2011 |
| JP | 2012-205207 A | 10/2012 |
| JP | 2013-27460 A | 2/2013 |

OTHER PUBLICATIONS

Official Communication issued in corresponding Japanese Patent Application No. 2014-021079, mailed on May 24, 2016.

* cited by examiner

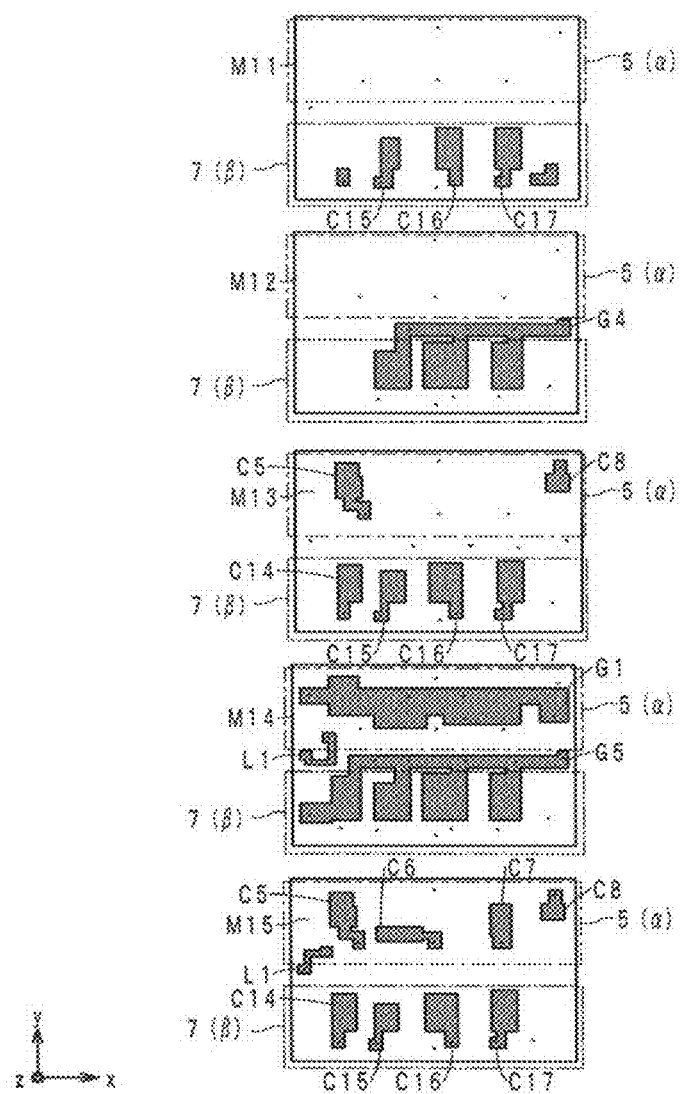

LOW PASS FILTER HAVING ATTENUATION POLE AND WAVE SPLITTER

BACKGROUND OF THE INVENTION

1. Field of the Invention

The present invention relates to a low pass filter having an attenuation pole near a pass band, and to a wave splitter including the low pass filter.

2. Description of the Related Art

Hitherto, an example of this type of low pass filter (hereinafter also referred to as an "LPF") is an LPF disclosed in Japanese Unexamined Patent Application Publication No. 2010-232765. This LPF includes a series arm and three parallel arms, which are first through third parallel arms. Two parallel resonance circuits, for example, are disposed on this series arm. The first parallel arm is disposed between an input terminal of the LPF and the preceding parallel resonance circuit. The second parallel arm is disposed between the two parallel resonance circuits. The third parallel arm is disposed between the subsequent parallel resonance circuit and an output terminal of the LPF. A capacitor is disposed on each of the first through third parallel arms.

Japanese Unexamined Patent Application Publication No. 2010-232765 does not disclose a specific arrangement of inductors and capacitors. However, Japanese Unexamined Patent Application Publication No. 6-176966 discloses an arrangement of inductors and capacitors of a filter (hereinafter such a filter may also be referred to as an "LC filter"), although this filter is not an LPF. In this LC filter, at least one capacitor (that is, an internal capacitor) defined by a plurality of inner electrodes is disposed within a dielectric substrate. On the top surface of the dielectric substrate, two chip coils and two capacitors (that is, external capacitors) are mounted. The internal capacitor, the chip coils, and the external capacitors are electrically connected to one another, thereby forming an LC filter. The chip coils, which are of a vertical-winding type, are mounted on the top surface of the dielectric substrate such that the axis of a core of each of the chip coils is substantially perpendicular to the top surface of the dielectric substrate. Accordingly, the axes of the chip coils are substantially parallel with each other. Concerning the arrangement of the chip coils, one of the chip coils is disposed at a corner of the dielectric substrate, while the other chip coil is disposed at another corner of the dielectric substrate, thereby providing a large distance between the chip coils. The chip coils are arranged in this manner in order to reduce the influence of magnetic coupling between the chip coils. As a result, the characteristics of the LC filter can be maintained.

However, on the other hand, with the arrangement of the chip coils used in this publication, it is necessary to provide a large distance between the chip coils, thereby making it difficult to reduce the size of the LPF.

SUMMARY OF THE INVENTION

Preferred embodiments of the present invention provide a low pass filter having an attenuation pole that is reduced in size and a wave splitter including such a low pass filter.

According to a first preferred embodiment of the present invention, a low pass filter having an attenuation pole includes a multilayer body including a first surface and a second surface; an input terminal, an output terminal, and a ground terminal provided on the second surface of the multilayer body; a plurality of parallel resonance circuits disposed on a series arm which connects the input terminal and the output terminal, each of the plurality of parallel resonance circuits including a capacitor and an inductor; and a capacitor disposed on a parallel arm which connects the series arm and a ground terminal. At least two of the inductors disposed on the series arm are wound inductors mounted on the first surface of the multilayer body, and a winding axis of one of the wound inductors is perpendicular or substantially perpendicular to a winding axis of the other one of the wound inductors.

According to a second preferred embodiment of the present invention, a low pass filter having an attenuation pole includes a multilayer body including a first surface and a second surface; an input terminal, an output terminal, and a ground terminal provided on the second surface of the multilayer body; at least one inductor disposed on a series arm which connects the input terminal and the output terminal; a plurality of parallel resonance circuits disposed on the series arm and disposed subsequent to the at least one inductor, each of the plurality of parallel resonance circuits including a capacitor and an inductor; and a capacitor disposed on a parallel arm which connects the series arm and a ground terminal. At least two of the inductors disposed on the series arm are wound inductors mounted on the first surface of the multilayer body, and a winding axis of one of the wound inductors is perpendicular or substantially perpendicular to a winding axis of the other one of the wound inductors.

According to a third preferred embodiment of the present invention, a wave splitter includes a multilayer body including a first surface and a second surface; an input terminal, a first output terminal, and a first ground terminal provided on the second surface of the multilayer body; a low pass filter having an attenuation pole disposed between the input terminal and the first output terminal on the multilayer body; a second output terminal and a second ground terminal provided on the second surface of the multilayer body; and a high pass filter that is disposed between the input terminal and the second output terminal on the multilayer body and that includes capacitors and inductors. The low pass filter includes a plurality of parallel resonance circuits disposed on a series arm which connects the input terminal and the first output terminal, each of the plurality of parallel resonance circuits including a capacitor and an inductor, and a capacitor disposed on a parallel arm which connects the series arm and a ground terminal. At least two of the inductors disposed on the series arm are wound inductors mounted on the first surface of the multilayer body, and a winding axis of one of the wound inductors is perpendicular or substantially perpendicular to a winding axis of the other one of the wound inductors.

According to a fourth preferred embodiment of the present invention, a wave splitter includes a multilayer body including a first surface and a second surface; an input terminal, a first output terminal, and a first ground terminal provided on the second surface of the multilayer body; a low pass filter having an attenuation pole disposed between the input terminal and the first output terminal on the multilayer body; a second output terminal and a second ground terminal provided on the second surface of the multilayer body; and a high pass filter that is disposed between the input terminal and the second output terminal on the multilayer body and that includes capacitors and inductors. The low pass filter includes at least one inductor disposed on a series arm which connects the input terminal and the first output terminal, a plurality of parallel resonance circuits disposed on the series arm, each of the plurality of parallel resonance circuits including a capacitor and an inductor, and a capacitor disposed on a parallel arm which connects the series arm and the first ground terminal. At least two of the inductors disposed on the series arm are wound inductors mounted on the first surface of the multilayer body, and a winding axis of one of the wound inductors is perpendicular or substantially perpendicular to a winding axis of the other one of the wound inductors.

According to the above-described preferred embodiments of the present invention, a magnetic flux generated in one of the wound inductors is prevented from passing through the other one of the wound inductors. With this arrangement, although the wound inductors are positioned close to each other, the magnetic coupling between the wound inductors is significantly reduced or prevented. Thus, it is possible to reduce the size of an LPF or a wave splitter.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4C is a top view of eleventh through fifteenth base layers of the multilayer body shown in FIG. 2B.

DETAILED DESCRIPTION OF THE PREFERRED EMBODIMENTS

A low pass filter having an attenuation pole (hereinafter simply referred to as an "LPF") and a wave splitter including the LPF according to preferred embodiments of the present invention will be described below in detail with reference to FIGS. 1 through 5B.

Figure 1:
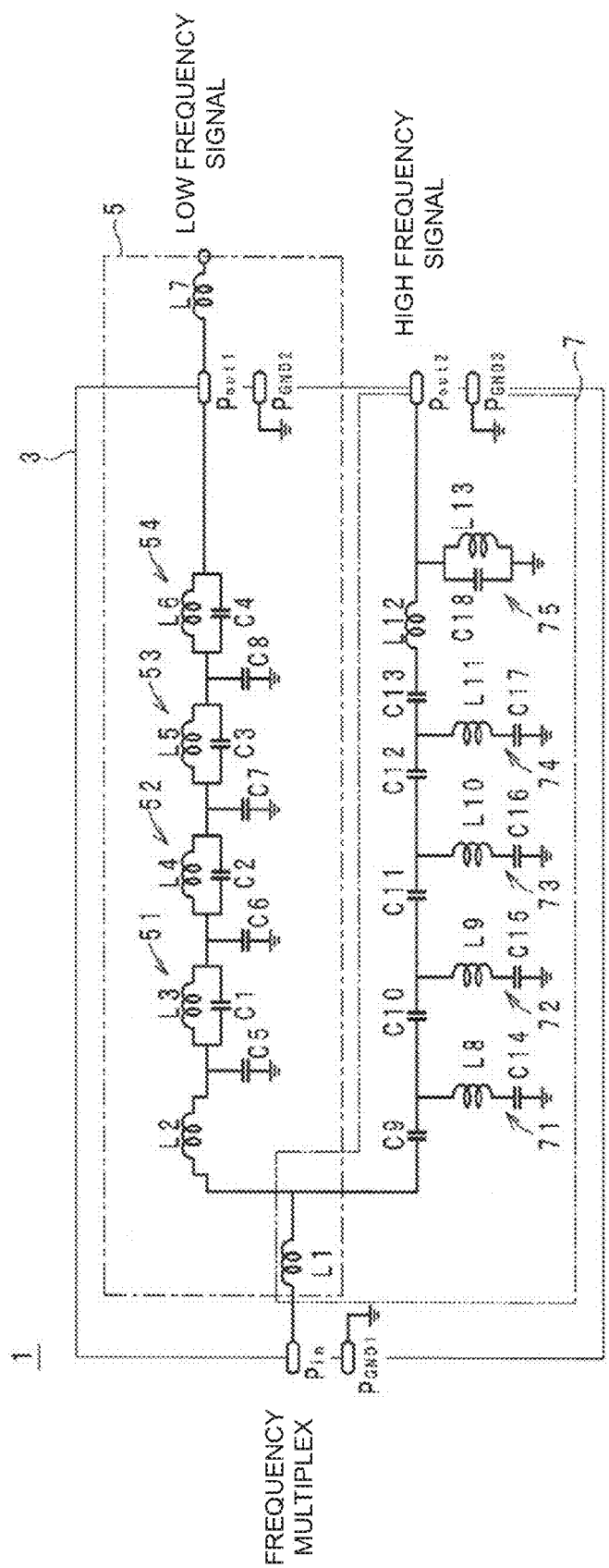
FIG. 1 is an equivalent circuit diagram of a wave splitter including an LPF according to a preferred embodiment of the present invention.

A wave splitter 1 includes, as shown in FIG. 1, a common input terminal $P_{in}$, a multilayer body 3, an LPF 5, a high pass filter (hereinafter simply referred to as an "HPF") 7, a first output terminal $P_{out1}$, a second output terminal $P_{out2}$, and a plurality of ground terminals $P_{GND1}$ through $P_{GND3}$.

A frequency multiplex signal to be split by the wave splitter 1 is input between the common input terminal $P_{in}$ and one of the plurality of ground terminals $P_{GND1}$ through $P_{GND3}$. In this frequency multiplex signal, for example, an about 65-MHz-band signal used in a cable television (hereinafter referred to as a "low frequency signal") and an about 87-MHz-band signal (hereinafter referred to as a "high frequency signal") are multiplexed.

In FIG. 1, the multilayer body 3 is shown as a rectangle indicated by the solid lines. The reason for this is to clearly distinguish elements integrated in the multilayer body 3 (that is, elements disposed within the rectangle indicated by the solid lines other than an inductor L7) from an external element which is not integrated in the multilayer body 3 (that is, the inductor L7 disposed outside the rectangle indicated by the solid lines). A detailed configuration of the multilayer body 3 will be discussed later, and is thus omitted here.

A low frequency signal in the frequency multiplex signal input into the common terminal Pin passes through the LPF5. As a result, a high frequency signal in frequency multiplex signal is attenuated in LPF 5. Accordingly, in the LPF 5, as a series arm which connects the common input terminal $P_{in}$ and the output terminal $P_{out1}$, inductors L1 and L2, four parallel resonance circuits 51 through 54, which are examples of a plurality of parallel resonance circuits, and the inductor L7 are provided. That is, on a signal path from the common input terminal $P_{in}$ to the output terminal $P_{out1}$, the inductors L1 and L2, the four parallel resonance circuits 51 through 54, and the inductor L7 are disposed and connected in this order. The inductor L7 is disposed outside the multilayer body 3, for example, on a circuit board 9 (see FIG. 2A) on which the wave splitter 1 is mounted. One end of the inductor L7 is connected to the output terminal $P_{out1}$. The parallel resonance circuit 51 includes an inductor L3 and a capacitor C1 connected in parallel with each other. The parallel resonance circuit 52 includes an inductor L4 and a capacitor C2 connected in parallel with each other. The parallel resonance circuit 53 includes an inductor L5 and a capacitor C3 connected in parallel with each other. The parallel resonance circuit 54 includes an inductor L6 and a capacitor C4 connected in parallel with each other.

The LPF 5 also includes capacitors C5 through C8. The capacitor C5 is disposed on a parallel arm which connects a node between the inductor L2 and the parallel resonance circuit 51 and a ground. The capacitor C6 is disposed on a parallel arm which connects a node between the parallel resonance circuits 51 and 52 and a ground. The capacitor C7 is disposed on a parallel arm which connects a node between the parallel resonance circuits 52 and 53 and a ground. The capacitor C8 is disposed on a parallel arm which connects a node between the parallel resonance circuits 53 and 54 and a ground.

A low frequency signal split from the input frequency multiplex signal by the LPF 5 appears between the other end of the inductor L7 (that is, the end which is not connected to the output terminal $P_{out1}$) and a ground. Passband characteristics of the above-described LPF 5 are primarily determined by the values of the inductors L1 through L7 and the capacitors C1 through C8. The passband characteristics of the LPF 5 are indicated by the solid curved lines shown in FIGS. 5A and 5B, and details thereof will be described below.

Referring back to FIG. 1, a high frequency signal in the frequency multiplex signal input into the common terminal Pin passes through the HPF 7. As a result, a low frequency signal in the frequency multiplex signal is attenuated in HPF 7. Accordingly, in the HPF 7, as a series arm which connects the common input terminal $P_{in}$ and the output terminal $P_{out2}$, the inductor L1, which is used in both of the HPF 7 and the LPF 5, capacitors C9 through C13, and an inductor L12 are provided. That is, on a signal path from the common input terminal $P_{in}$ to the output terminal $P_{out2}$, the inductor L1, the capacitors C9 through C13, and the inductor L12 are disposed and connected in this order.

The HPF 7 also includes series resonance circuits 71 through 74 and a parallel resonance circuit 75. The series resonance circuit 71 includes an inductor L8 and a capacitor C14 connected in series with each other, and is disposed on a parallel arm which connects a node between the capacitors C9 and C10 and a ground. The series resonance circuit 72 includes an inductor L9 and a capacitor C15 connected in series with each other, and is disposed on a parallel arm which connects a node between the capacitors C10 and C11 and a ground. The series resonance circuit 73 includes an inductor L10 and a capacitor C16 connected in series with each other, and is disposed on a parallel arm which connects a node between the capacitors C11 and C12 and a ground. The series resonance circuit 74 includes an inductor L11 and a capacitor C17 connected in series with each other, and is disposed on a parallel arm which connects a node between the capacitors C12 and C13 and a ground. An inductor L13 and a capacitor C18 are connected in parallel with each other so as to define the parallel resonance circuit 75. The parallel resonance circuit 75 is disposed on a parallel arm which connects a node between the inductor L12 and the output terminal $P_{out2}$ and a ground. The inductor L12 and the capacitor C18 define a phase adjusting circuit configured to suppress a decrease in the high frequency characteristics of the HPF 7.

A high frequency signal split from the input frequency multiplex signal by the HPF 7 appears between the output terminal $P_{out2}$ and the ground terminal $P_{GND3}$. Passband characteristics of the above-described HPF 7 are primarily determined by the values of the inductors L1, L8 through L13 and the capacitors C9 through C18. The passband characteristics of the HPF 7 are indicated by the short broken curved lines shown in FIGS. 5A and 5B.

As a practical application of the wave splitter 1, as shown in FIGS. 2A through 4D, the wave splitter 1 indicated by the equivalent circuit shown in FIG. 1 includes the common input terminal $P_{in}$, the LPF 5 (except for the inductor L7), the HPF 7, the output terminals $P_{out1}$ and $P_{out2}$, and the ground terminals $P_{GND1}$ through $P_{GND3}$ provided on the multilayer body 3. The wave splitter 1 is accommodated, as shown in, for example, FIG. 2A, within a casing (not shown) in a state in which the wave splitter 1 is mounted on the circuit board 9 and the output terminal $P_{out1}$ and the inductor L7 are electrically connected to each other.

In the following description, an x axis, a y axis, and a z axis shown in FIGS. 2A through 4D will be discussed below. The x axis, y axis, and z axis are perpendicular to each other. In this preferred embodiment, the x axis indicates a lateral direction (that is, the horizontal direction) of the wave splitter 1, the y axis indicates a depth direction (that is, the front and back direction) of the wave splitter 1, and the z axis indicates a height direction (that is, the vertical direction) of the wave splitter 1. The z axis also indicates a direction in which base layers M are stacked on each other (see FIG. 2B) and a direction perpendicular to a first surface S1 and a second surface S2 (see FIG. 3) of the multilayer body 3 on which the inductors L2 through L11 are mounted.

The multilayer body 3 preferably has a rectangular or substantially rectangular parallelepiped shape including the first surface S1 (that is, the top surface) and the second surface S2 (that is, the bottom surface) which oppose each other in the z-axis direction. The multilayer body 3 is formed preferably by stacking a plurality of base layers M on each other. In this preferred embodiment, the multilayer body 3 is formed, as shown in FIG. 2B, by stacking first through nineteenth base layers M1 through M19 in this order from the top to the bottom. In the following description, the base layers M1 through M19 may also be collectively referred to as the "base layers M"). In this preferred embodiment, each base layer M is preferably made of ceramics, such as low temperature co-fired ceramics (LTCC), for example.

The base layers M preferably have the same or substantially the same rectangular shape as viewed from above in the z axis direction. In this preferred embodiment, it is assumed that the length of each base layer M in the x axis direction is about 10 mm and the width of each base layer M in the y axis direction is about 8 mm, for example. The thicknesses of the base layers M in the z axis direction are, for example, as follows. Preferably, the first base layer M1, which is the topmost layer, has a thickness of about 200 μm, the second base layer M2 immediately under the first base layer M1 has a thickness of about 200 μm, the tenth base layer M10 has a thickness of about 300 μm, and the eighteenth base layer M18 has a thickness of about 200 μm. The other base layers M preferably have a thickness of about 15 μm, for example.

Figure 2A:
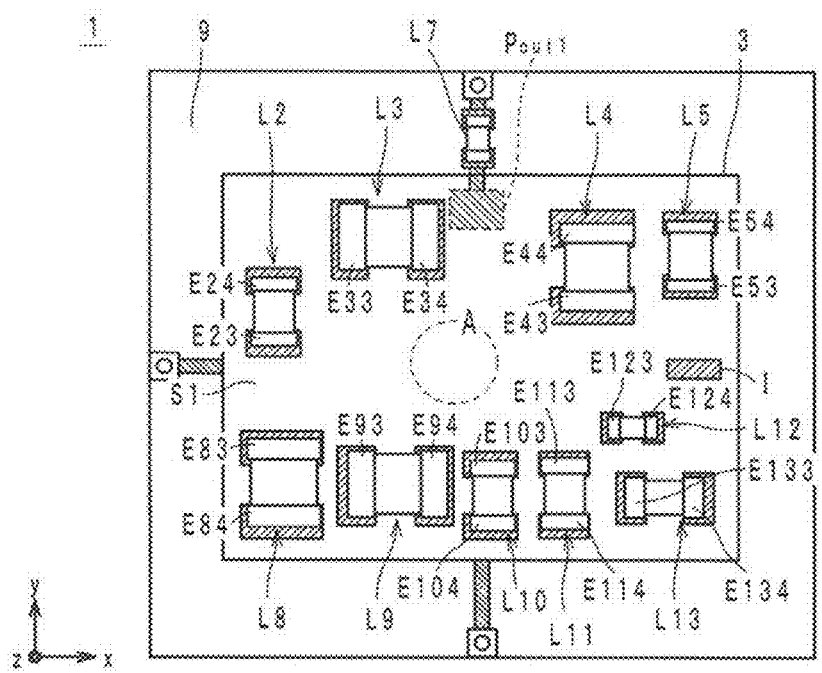
FIG. 2A is a top view of the wave splitter shown in FIG. 1.
Figure 2B:
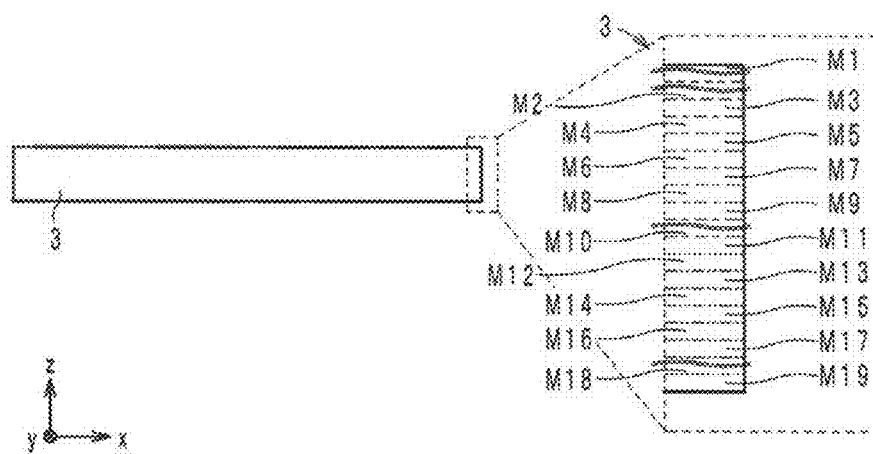
FIG. 2B is a front view of a multilayer body of the wave splitter shown in FIG. 2A.

The top surface of the wave splitter 1 (that is, the first base layer M1) is shown in FIG. 2A. The inductors L2 through L5 and L8 through L13 are mounted on the first surface S1 of the first base layer M1 in the positive direction of the z axis (that is, on the top surface of the multilayer body 3). Since the wave splitter 1 splits signals of a frequency band around 100 MHz, for example, an inductor having a relatively large inductance, such as several hundreds of nH, for example, is required. Accordingly, it is preferable that the inductors L2 through L5 and L8 through L13 have a high Q factor as well as a relatively large inductance. Additionally, in order to reduce the influence of noise, it is preferable that the inductors L2 through L5 and L8 through L13 are wound chip inductors. Additionally, in order to reduce the height of the wave splitter 1, it is more preferable that the inductors L2 through L5 and L8 through L13 are horizontally wound chip inductors. Details of the configurations of the inductors L2 through L5 and L8 through L13 will be discussed below.

Figure 3:
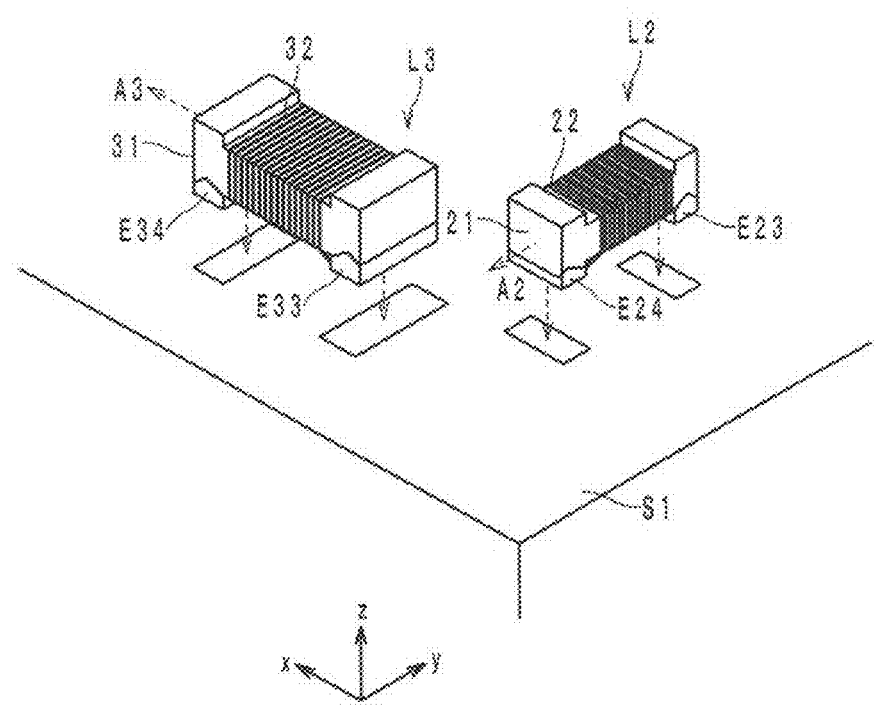
FIG. 3 is a perspective view of two inductors among inductors shown in FIG. 2A, the winding axes of the two inductors being perpendicular or substantially perpendicular to each other.

FIG. 3 is a perspective view of the configuration and arrangement of the inductors L2 and L3 shown in FIG. 2A. The inductor L2 includes a core 21, a wire 22, and two outer electrodes E23 and E24. The core 21 extends parallel or substantially parallel to the first surface S1. The wire 22 is helically wound around the core 21. More specifically, the wire 22 is wound on the peripheral surface of the core 21 such that it defines a helical shape advancing from one end to the other end of the core 21 while turning around a winding axis A2 which is parallel or substantially parallel to the first surface S1. The outer electrode E23 is disposed on one end of the core 21, and the outer electrode E24 is disposed on the other end of the core 21. One end of the wire 22 is connected to the outer electrode E23, and the other end of the wire 22 is connected to the outer electrode E24. The inductor L2 is mounted on corresponding land electrodes disposed on the first surface S1 via the outer electrodes E23 and E24.

The inductance of the inductor L3 differs from the inductance of the inductor L2. The inductor L3 includes a core 31, a wire 32, and outer electrodes E33 and E34. The size of the core and the size of the outer electrodes E33 and E34 are respectively different from the size of the core 21 and the size of the outer electrodes E23 and E24. The number of turns and/or the diameter of the wire 32 are different from those of the wire 22. The inductor L3 is mounted on corresponding land electrodes disposed on the first surface S1 such that a winding axis A3 is perpendicular or substantially perpendicular to the winding axis A2.

Referring back to FIG. 2A, the inductors L4 and L5 are also horizontally wound chip inductors having inductances and sizes that satisfy the requirement specifications. The inductors L4 and L5 are arranged such that the winding axis of the inductor L4 and the winding axis of the inductor L5 are parallel or substantially parallel with each other and such that the winding axis of the inductor L4 is perpendicular or substantially perpendicular to that of the inductor L3.

Figure 5A:
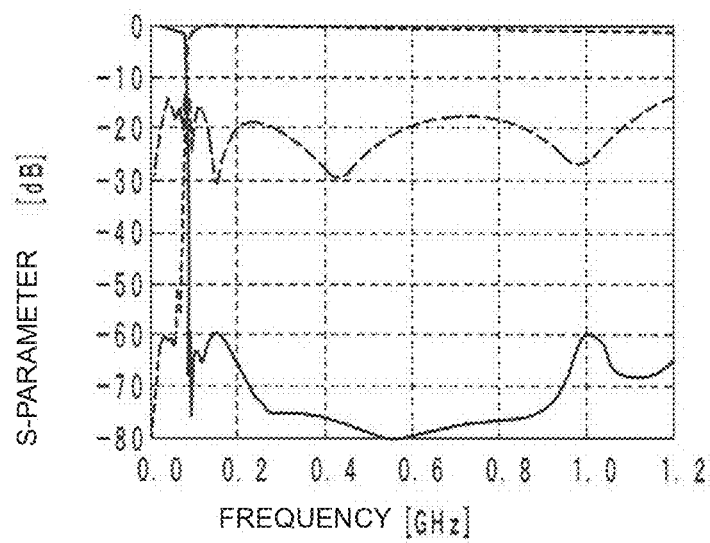
FIG. 5A is a graph showing passband characteristics (0 to 1.5 GHz) of the LPF shown in FIG. 1.
Figure 5B:
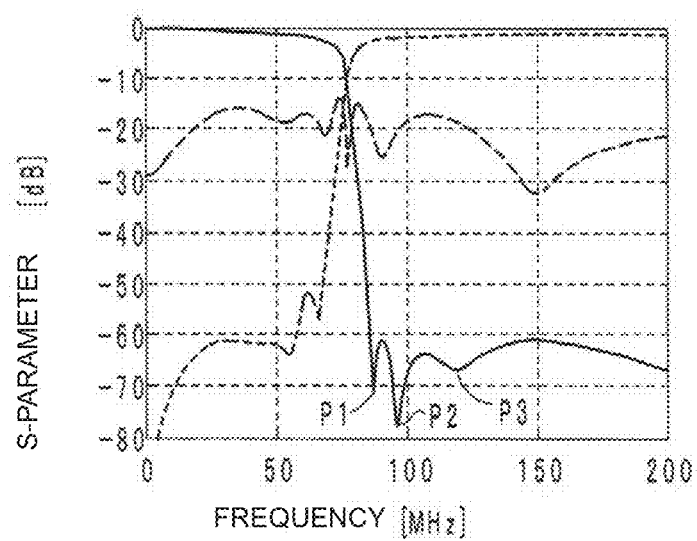
FIG. 5B is a graph showing passband characteristics (0 to 200 MHz) of the LPF shown in FIG. 1.

The LPF 5 is configured as follows so that the passband characteristics indicated by the solid curved lines in FIGS. 5A and 5B are achieved. Among the parallel resonance circuits 51 through 54, the parallel resonance circuit 52 has the lowest resonant frequency. Accordingly, an attenuation pole P1 is defined by the parallel resonance circuit 52, as shown in FIG. 5B. The parallel resonance circuit 51 has the second lowest resonant frequency. Accordingly, an attenuation pole P2 is defined by the parallel resonance circuit 51, as shown in FIG. 5B. The parallel resonance circuit 53 has the third lowest resonant frequency. Accordingly, an attenuation pole P3 is defined by the parallel resonance circuit 53, as shown in FIG. 5B.

The winding axis of the inductor L4 included in the parallel resonance circuit 52 having the lowest resonant frequency is perpendicular or substantially perpendicular to that of the inductor L3 included in the parallel resonance circuit 51 having the second lowest resonant frequency. Additionally, the winding axis of the inductor L4 included in the parallel resonance circuit having the lowest resonant frequency is parallel or substantially parallel with that of the inductor L5 included in the parallel resonance circuit 53 having the third lowest resonant frequency.

The other inductors L8 through L13 are also horizontally wound chip inductors having inductances and sizes that satisfy the requirement specifications.

Similarly to the inductors L2 and L3, the inductors L8 and L9 are mounted on the first surface S1 such that the winding axis of the inductor L8 is perpendicular or substantially perpendicular to that of the inductor L9. The inductors L4, L5, L10, and L11 are mounted on the first surface S1 such that the winding axis of each of the inductors L4, L5, L10, and L11 is parallel or substantially parallel with that of the winding axis A2 of the inductor L2. The inductors L12 and L13 are mounted on the first surface S1 such that the winding axis of each of the inductors L12 and L13 is parallel or substantially parallel with the winding axis A3 of the inductor L3.

A surface-mount device (not shown) is used to surface-mount a finished product of the wave splitter 1 on the circuit board 9. This surface-mount device applied suction to a finished product of the wave splitter 1 supplied from a supply device (not shown) by using a nozzle provided in the surface-mount device, and mounts the wave splitter 1 at a predetermined location of the circuit board 9. To implement this mounting operation, a suction area A preferably having a diameter of about 200 μm, for example, is defined substantially at the center of the first surface S1 of the multilayer body 3, and more specifically, around a point at which the diagonal lines of the first surface S1 intersect with each other on the first surface S1. In FIG. 2A, the suction area A is an area surrounded by an imaginary circle indicated by the broken line. The inductors L2 through L5 and L8 through 13 are not mounted on an area within the predefined suction area A and are mounted on an area outside the suction area A.

In order to improve the precision in mounting the wave splitter 1 on the circuit board 9, an identification mark I is indicated at a predetermined position of the first surface S1, for example, at an end portion in the positive direction of the x axis on the first surface S1. The surface-mount device captures an image of the wave splitter 1 supplied by the supply device by using a camera, and then determines a correct position of the wave splitter 1 to which suction is applied by the nozzle, on the basis of the identification mark I shown in the captured image.

A description will now be provided, with reference to FIGS. 4A through 4D, of components of the LPF 5 disposed within the multilayer body 3 or on the surface of the multilayer body 3. In FIGS. 4A through 4D, in order to distinguish the components of the LPF 5 from each other, an imaginary rectangular portion α indicated by the long dashed dotted lines is shown in the positive direction of the y axis of each base material M, and the components of the LPF 5 are disposed within this imaginary rectangular portion α. In contrast to the rectangular portion α, an imaginary rectangular portion β indicated by the long dashed double-dotted lines is shown in the negative direction of the y axis of each base material M. The components of the HPF 7 are disposed within this rectangular portion β.

Figure 4A:
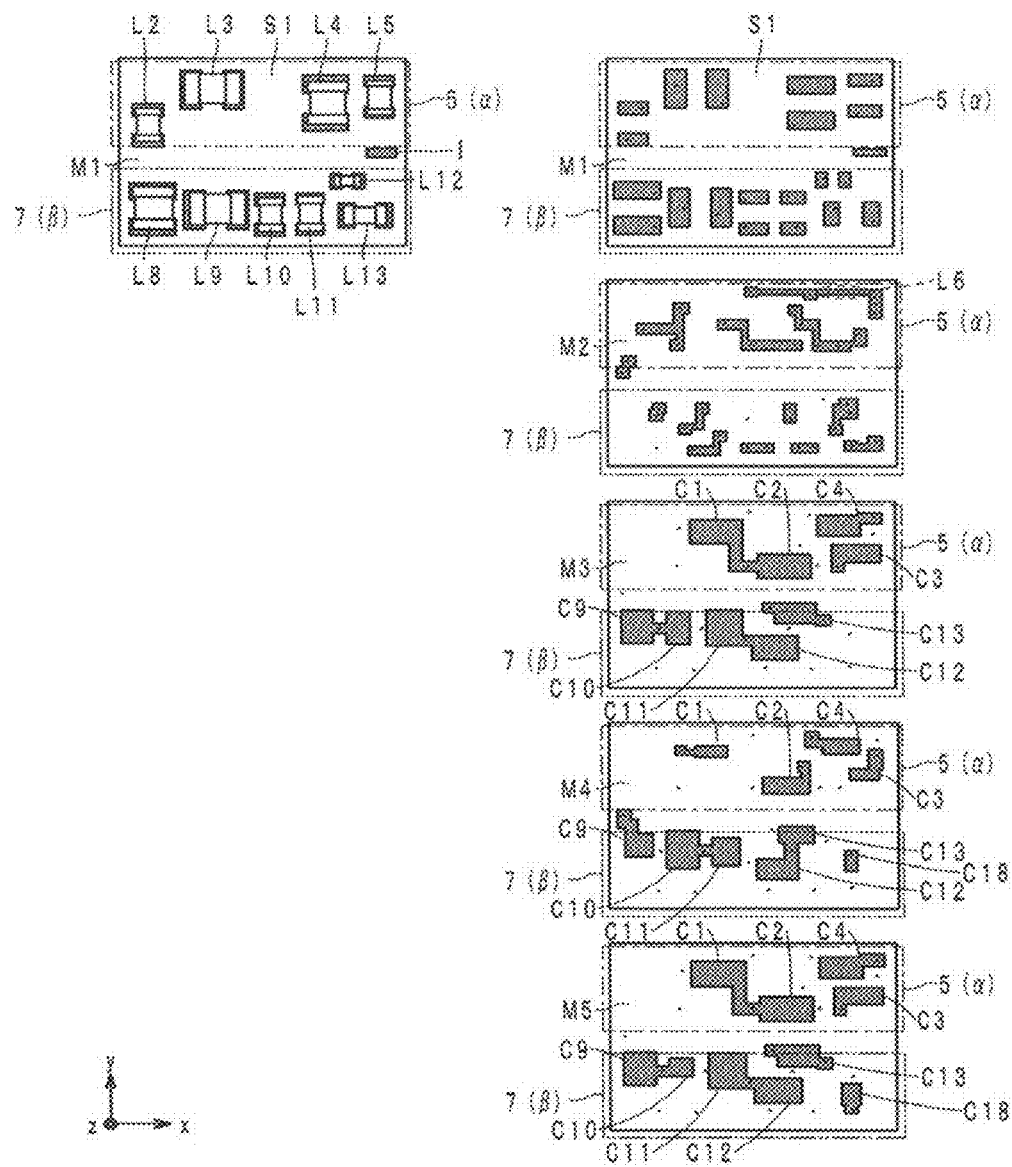
FIG. 4A is a top view of first through fifth base layers of the multilayer body shown in FIG. 2B.

On the right side of the topmost section of FIG. 4A, pairs of land electrodes (indicated by the hatched portions), each pair including two land electrodes, are shown. These pairs of lands electrodes are provided on the first surface S1 in order to mount the inductors L2 through L5 and L8 through L13, which are shown on the left side. Each land electrode is preferably made of a conductive material, such as copper, for example.

Figure 4B:
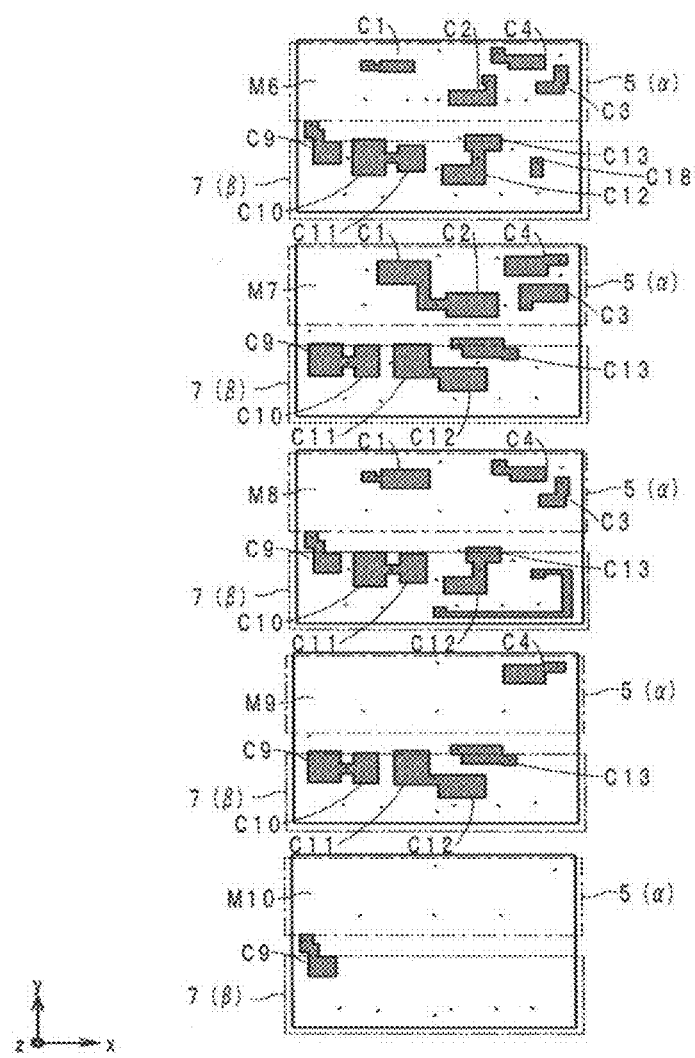
FIG. 4B is a top view of sixth through tenth base layers of the multilayer body shown in FIG. 2B.
Figure 4D:
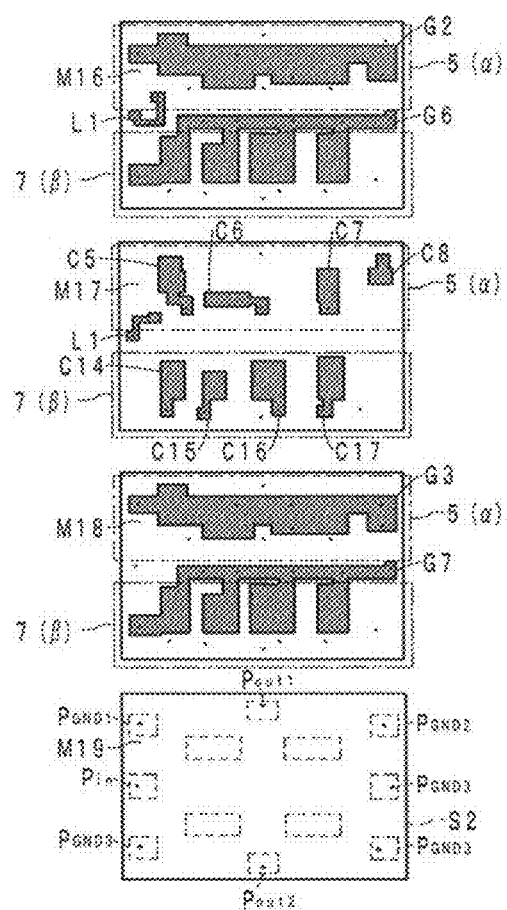
FIG. 4D is a top view of sixteenth through nineteenth base layers of the multilayer body shown in FIG. 2B.

The common input terminal $P_{in}$ is provided, as shown in FIG. 4D, on the second surface S2 of the multilayer body 3, which is disposed in the negative direction of the z axis (that is, on the back side of the base layer M19). More specifically, the common input terminal $P_{in}$ is provided in the negative direction of the x axis and substantially at the center of the y axis on the second surface S2. The common input terminal $P_{in}$ is connected to one end of the inductor L1 through via-conductors which pass through the base layers M17 through M19. Each via-conductor is preferably made of a conductive material, such as copper, for example. Each via-conductor is provided in a hole passing through a corresponding base layer M in the z-axis direction, and is connected to a via-conductor provided in another base layer M. The via-conductors are indicated by "." (period) in FIGS. 4A through 4D, and are not denoted by reference numerals so as to enhance the viewability.

It is sufficient that the inductor L1 has an inductance smaller than another inductor, for example, the inductor L2, and thus, the inductor L1 is provided within the multilayer body 3. More specifically, as shown in FIGS. 4C and 4D, the inductor L1 includes a linear pattern conductor provided on the top surface of each of the base layers M14 through M17 and via-conductors through which these linear pattern conductors are connected in series with each other. The inductor L1 is a helical coil having a helical shape extending in the z-axis direction while turning around the winding axis which is parallel or substantially parallel with the z axis. The other end of the inductor L1 (that is, the end which is not connected to the common input terminal $P_{in}$) is electrically connected to the outer electrode E23 of the inductor L2 and to the capacitor C9 (which will be described below) of the HPF 7 through via-conductors.

The outer electrode E24 of the inductor L2 is electrically connected to the capacitor C5 through via-conductors. As shown in FIGS. 4C and 4D, the capacitor C5 includes a planar pattern conductor provided on the top surface of each of the base layers M13, M15, and M17. More specifically, the planar pattern conductors provided on the base layers M13, M15, and M17 are connected to the outer electrode E24 of the inductor L2 in this order through several via-conductors, and also oppose one or two of ground conductors G1, G2, and G3 in the z-axis direction. The ground conductors G1, G2, and G3 are provided on the top surfaces of the base layers M14, M16, and M18, respectively, and are electrically connected to the ground terminals $P_{GND1}$ and $P_{GND2}$, which will be described below. Details of the ground conductors G1, G2, and G3 will be described below.

The outer electrode E34 of the inductor L3 is electrically connected to the outer electrode E24 of the inductor L2 through via-conductors. The capacitor C1 is provided within the multilayer body 3 such that it is connected in parallel with the inductor L3 through via-conductors. In this preferred embodiment, as shown in FIGS. 4A and 4B, the capacitor C1 includes a planar pattern conductor provided on the top surface of each of the base layers M3 through M8. More specifically, among the base layers M3 through M8, two planar pattern conductors provided on two adjacent base layers (for example, the base layers M3 and M4) in the z-axis direction oppose each other in the z-axis direction with one base layer therebetween. The planar pattern conductors provided on the base layers M4, M6, and M8 are connected in this order through via-conductors and are also electrically connected to the outer electrodes E24 and E34 of the inductors L2 and L3, respectively. The planar pattern conductors provided on the base layers M3, M5, and M7 are connected in this order through via-conductors and are also electrically connected to the outer electrode E33 of the inductor L3.

The outer electrode E33 of the inductor L3 is also electrically connected to the capacitor C6 through via-conductors. As shown in FIGS. 4C and 4D, the capacitor C6 includes a planar pattern conductor provided on the top surface of each of the base layers M15 and M17. The planar pattern conductors of the capacitor C6 are electrically connected to the planar pattern conductors of the capacitors C1 and C2 provided on the base layers M3, M5, and M7 through via-conductors. The planar pattern conductor of the capacitor C6 provided on the base layer M15 opposes the ground conductors G1 and G2 in the z-axis direction, and the planar pattern conductor of the capacitor C6 provided on the base layer M17 opposes the ground terminals G2 and G3 in the z-axis direction. The capacitor C6 is configured in this manner.

An outer electrode E43 of the inductor L4 is electrically connected to the outer electrode E33 of the inductor L3 through via-conductors. The capacitor C2 is provided within the multilayer body 3 such that it is connected in parallel with the inductor L4 through via-conductors. In this preferred embodiment, as shown in FIGS. 4A and 4B, the capacitor C2 includes a planar pattern conductor provided on the top surface of each of the base layers M3 through M7. More specifically, among the base layers M3 through M7, two planar pattern conductors provided on two adjacent base layers in the z-axis direction oppose each other in the z-axis direction with one base layer therebetween. The planar pattern conductors of the capacitor C2 provided on the base layers M3, M5, and M7 are electrically connected in this order through via-conductors and are also electrically connected to the outer electrodes E43 of the inductor L4. The planar pattern conductors of the capacitor C2 provided on the base layers M4 and M6 are electrically connected to an outer electrode E44 of the inductor L4 through via-conductors.

The outer electrode E44 of the inductor L4 is also connected to one end of the capacitor C7 through via-conductors. As shown in FIGS. 4C and 4D, the capacitor C7 includes a planar pattern conductor provided on the top surface of each of the base layers M15 and M17. More specifically, the planar pattern conductor provided on the base layer M15 opposes the ground conductors G1 and G2 in the z-axis direction, and the planar pattern conductor provided on the base layer M17 opposes the ground terminals G2 and G3 in the z-axis direction. These planar pattern conductors are electrically connected to the outer electrode E44 of the inductor L4 through via-conductors.

An outer electrode E53 of the inductor L5 is connected to the outer electrode E44 of the inductor L4 through via-conductors. The capacitor C3 is provided within the multilayer body 3 such that it is connected in parallel with the inductor L5 through via-conductors. In this preferred embodiment, as shown in FIGS. 4A and 4B, the capacitor C3 includes a planar pattern conductor provided on the top surface of each of the base layers M3 through M8. More specifically, among the base layers M3 through M8, two planar pattern conductors provided on two adjacent base layers (for example, the base layers M3 and M4) in the z-axis direction oppose each other in the z-axis direction with one base layer therebetween. The planar pattern conductors of the capacitor C3 provided on the base layers M3, M5, and M7 are connected in this order through via-conductors and are also electrically connected to the outer electrodes E53 of the inductor L5. The planar pattern conductors of the capacitor C3 provided on the base layers M4, M6, and M8 are connected in this order through via-conductors, and are also electrically connected to an outer electrode E54 of the inductor L5.

The outer electrode E54 of the inductor L5 is connected to one end of the capacitor C8 through via-conductors. As shown in FIGS. 4C and 4D, the capacitor C8 includes a planar pattern conductor provided on the top surface of each of the base layers M13, M15, and M17. These planar pattern conductors oppose one or two of the ground conductors G1 through G3 in the z-axis direction. The planar pattern conductors of the capacitor C8 provided on the base layers M13, M15, and M17 are connected in this order through via-conductors, and are also electrically connected to the outer electrode E54 of the inductor L5.

The outer electrode E54 of the inductor L5 is also connected to one end of the inductor L6 through via-conductors. It is sufficient that the inductor L6 has an inductance smaller than another inductor, for example, the inductor L2, and thus, the inductor L6 is provided within the multilayer body 3. The inductor L6 is indicated by an imaginary elliptical portion by the broken lines in the second section from the top of FIG. 4A. The inductor L6 is a linear conductor pattern provided on the top surface of the base layer M2. The other end of the inductor L6 is electrically connected to the output terminal $P_{OUT1}$ through via-conductors. On the top surface of the base layer M2, in addition to the inductor L6, some wiring conductors are configured to connect the inductors L2 through L5 and L8 through L13 mounted on the first surface S1 to the inductors L1 and L6 and the capacitors C1 through C18 disposed within the multilayer body 3.

The capacitor C4 is arranged within the multilayer body such that it is connected in parallel with the inductor L6 through via-conductors. In this preferred embodiment, as shown in FIGS. 4A and 4B, the capacitor C4 includes a planar pattern conductor provided on the top surface of each of the base layers M3 through M9. More specifically, among the base layers M3 through M9, two planar pattern conductors provided on two adjacent base layers (for example, the base layers M3 and M4) in the z-axis direction oppose each other in the z-axis direction with one base layer therebetween. The planar pattern conductors of the capacitor C4 provided on the base layers M3, M5, M7, and M9 are electrically connected in this order through via-conductors and are also electrically connected to one end of the inductor L6. The planar pattern conductors of the capacitor C4 provided on the base layers M4, M6, and M8 are connected in this order through via-conductors, and are also electrically connected to the other end of the inductor L6.

As discussed above, as shown in FIGS. 4C and 4D, the ground conductors G1, G2, and G3 are planar pattern conductors provided on the top surfaces of the base layers M14, M16, and M18, respectively. The ground conductor G1 opposes, as a single unit, in the z-axis direction the planar pattern conductors of the capacitors C5 and C8 provided on the base layers M13 and M15 and the planar pattern conductors of the capacitors C6 and C7 provided on the base layer M15. The ground conductor G1 also extends in the x-axis direction. As well as the ground conductor G1, the ground conductor G2 opposes in the z-axis direction the planar pattern conductors of the capacitors C5 through C8 provided on the base layers M15 and M17, and the ground conductor G3 opposes in the z-axis direction the planar pattern conductors of the capacitors C5 through C8 provided on the base layer M17. The ground conductors G2 and G3 also extend in the x-axis direction.

The ground conductors G1, G2, and G3 are connected to each other such that they are arranged in this order in the z-axis direction through via-conductors. In this preferred embodiment, on the base layer M14, a total of five via-conductors are provided under the ground conductor G1 and at four locations which are displaced from each other in the x-axis direction. On each of the base layers M16 and M18, five via-conductors are provided at the same locations as those on the base layer M14 in the x-y plane. The ground conductor G3 is connected to the ground terminals $P_{GND1}$ and $P_{GND2}$ disposed at both side of the second surface S2 of the multilayer body 3 in the x-axis direction through via-conductors provided at both sides of the base layers M18 and M19 in the x-axis direction. In this manner, by providing many via-conductors in the x-axis direction, it is possible to prevent a current to flow through the ground conductors G1 through G3 in the x-axis direction. As a result, in the ground conductors G1 through G3, a current flows principally in the z-axis direction so as to decrease the length of a current path, thus significantly reducing or preventing the generation of inductance components in the ground conductors G1 through G3.

The output terminal $P_{out1}$ is provided on the second surface S2 of the baser layer M19. More specifically, on the second surface S2, the output terminal $P_{out1}$ is disposed at the end portion in the positive direction of the y axis and at substantially the center of the x-axis direction. The output terminal $P_{out1}$ is connected to the other end of the linear pattern conductor defining the inductor L6 (see FIG. 4A) (that is, the end which is not connected to the inductor L5) through via-conductors. On the second surface S2, the two ground terminals $P_{GND2}$ and $P_{GND1}$ are respectively disposed in the positive direction and the negative direction of the x axis with the output terminal $P_{out1}$ therebetween. As discussed above, the external inductor L7 is connected to the output terminal $P_{out1}$.

Components of the HPF 7 disposed in and on the multilayer body 3 will be described below in detail with reference to FIGS. 1 and 4A through 4D. As discussed above, the capacitor C9 is connected to the inductor L1. As shown in FIGS. 4A and 4B, the capacitor C9 includes a planar pattern conductor provided on the top surface of each of the base layers M3 through M10. More specifically, among the base layers M3 through M10, two planar pattern conductors provided on two adjacent base layers in the z-axis direction oppose each other in the z-axis direction with one base layer therebetween. The planar pattern conductors of the capacitor C9 provided on the base layers M3, M5, M7, and M9 are connected in this order through via-conductors, and are also electrically connected to an outer electrode E83 of the inductor L8. The planar pattern conductors of the capacitor C9 provided on the base layers M4, M6, M8, and M10 are connected in this order through via-conductors, and are also electrically connected to the outer electrode E23 of the inductor L2.

An outer electrode E84 of the inductor L8 is connected to planar pattern conductors of the capacitor C14 through via-conductors. As shown in FIGS. 4C and 4D, the capacitor C14 includes a planar pattern conductor provided on the top surface of each of the base layers M13, M15, and M17. The planar pattern conductors of the capacitor C14 provided on the base layers M13, M15, and M17 oppose one or two of ground conductors G5 through G7 in the z-axis direction. These three planar pattern conductors are connected in this order through via-conductors, and are also connected to the outer electrode E84 of the inductor L8. The inductor L8 and the capacitor C14 define the series resonance circuit 71.

The capacitor C10 is connected to the other end of the capacitor C9 (that is, the end which is not connected to the inductor L1). In this preferred embodiment, as shown in FIGS. 4A and 4B, the capacitor C10 includes a planar pattern conductor provided on the top surface of each of the base layers M3 through M9. More specifically, among the base layers M3 through M9, two planar pattern conductors provided on two adjacent base layers in the z-axis direction oppose each other in the z-axis direction with one base layer therebetween. The planar pattern conductors of the capacitor C10 provided on the base layers M3, M5, M7, and M9 are connected in this order through via-conductors, and are also electrically connected to the planar pattern conductors of the capacitor C9 on the base layers M3, M5, M7, and M9, respectively, and to the outer electrode E83 of the inductor L8. The planar pattern conductors of the capacitor C10 provided on the base layers M4, M6, and M8 are connected in this order through via-conductors, and are also electrically connected to an outer electrode E93 of the inductor L9.

An outer electrode E94 of the inductor L9 is connected to the capacitor C15 through via-conductors. The inductor L9 and the capacitor C15 define the series resonance circuit 72. As shown in FIGS. 4C and 4D, the capacitor C15 includes a planar pattern conductor provided on the top surface of each of the base layers M11, M13, M15, and M17. These planar pattern conductors oppose ground conductors G4, G5, G6, and G7 provided on the base layers M12, M14, M16, and M18, respectively, in the z-axis direction. The four planar pattern conductors of the capacitor C15 are connected to each other through via-conductors, and are also electrically connected to the outer electrode E94 of the inductor L9.

The capacitor C11 is electrically connected to the capacitor C10. In this preferred embodiment, as shown in FIGS. 4A and 4B, the capacitor C11 includes a planar pattern conductor provided on the top surface of each of the base layers M3 through M9. More specifically, among the base layers M3 through M9, two planar pattern conductors provided on two adjacent base layers in the z-axis direction oppose each other in the z-axis direction with one base layer therebetween. The planar pattern conductors of the capacitor C11 provided on the base layers M3, M5, M7, and M9 are connected in this order through via-conductors, and are also electrically connected to the planar pattern conductors of the capacitor C12 on the base layers M3, M5, M7, and M9, respectively, and to an outer electrode E103 of the inductor L10. The planar pattern conductors of the capacitor C11 provided on the base layers M4, M6, and M8 are connected in this order through via-conductors, and are also electrically connected to planar pattern conductors of the capacitor C10 on the base layers M4, M6, and M8, respectively, and to the outer electrode E93 of the inductor L9.

An outer electrode E104 of the inductor L10 is connected in series with the capacitor C16 through via-conductors. The inductor L10 and the capacitor C16 define the series resonance circuit 73. As shown in FIGS. 4C and 4D, the capacitor C16 includes a planar pattern conductor provided on the top surface of each of the base layers M11, M13, M15, and M17. These planar pattern conductors oppose one or two of the ground conductors G4, G5, G6, and G7 in the z-axis direction. These planar pattern conductors are connected in series with each other through via-conductors and are also electrically connected to the outer electrode E104 of the inductor L10.

The capacitor C12 is electrically connected to the capacitor C11 and the inductor L10. In this preferred embodiment, as shown in FIGS. 4A and 4B, the capacitor C12 includes a planar pattern conductor provided on the top surface of each of the base layers M3 through M9. More specifically, among the base layers M3 through M9, two planar pattern conductors provided on two adjacent base layers in the z-axis direction oppose each other in the z-axis direction with one base layer therebetween. The planar pattern conductors of the capacitor C12 provided on the base layers M3, M5, M7, and M9 are connected in this order through via-conductors, and are also electrically connected to the planar pattern conductors of the capacitor C11 on the base layers M3, M5, M7, and M9, respectively, and to the outer electrode E103 of the inductor L10. The planar pattern conductors of the capacitor C12 provided on the base layers M4, M6, and M8 are connected in this order through via-conductors, and are also electrically connected to planar pattern conductors of the capacitor C13 on the base layers M4, M6, and M8, respectively, and to an outer electrode E113 of the inductor L11.

The outer electrode E113 of the inductor L11 is connected to the capacitor C12 through via-conductors. An outer electrode E114 of the inductor L11 is electrically connected to the capacitor C17 through via-conductors. The inductor L11 and the capacitor C17 define the series resonance circuit 74. As shown in FIGS. 4C and 4D, the capacitor C17 includes a planar pattern conductor provided on the top surface of each of the base layers M11, M13, M15, and M17. These planar pattern conductors oppose one or two of the ground conductors G4, G5, G6, and G7 in the z-axis direction. These planar pattern conductors are connected in series with each other through via-conductors and are also electrically connected to the outer electrode E114 of the inductor L11.

The capacitor C13 is electrically connected to the capacitor C12 and the inductor L11. In this preferred embodiment, as shown in FIGS. 4A and 4B, the capacitor C13 includes a planar pattern conductor provided on the top surface of each of the base layers M3 through M9. More specifically, among the base layers M3 through M9, two planar pattern conductors provided on two adjacent base layers in the z-axis direction oppose each other in the z-axis direction with one base layer therebetween. The planar pattern conductors of the capacitor C13 provided on the base layers M3, M5, M7, and M9 are connected in this order through via-conductors, and are also electrically connected to an outer electrode E123 of the inductor L12. The planar pattern conductors of the capacitor C13 provided on the base layers M4, M6, and M8 are connected in this order through via-conductors, and are also electrically connected to planar pattern conductors forming the capacitor C12 on the base layers M4, M6, and M8, respectively, and to the outer electrode E113 of the inductor L11.

An outer electrode E124 of the inductor L12 is electrically connected to the inductor L13, the capacitor C18, and the output terminal $P_{out2}$ through via-conductors. The inductor L13 and the capacitor C18 define the parallel resonance circuit 75. As shown in FIGS. 4A and 4B, the capacitor C18 includes a planar pattern conductor provided on the top surface of each of the base layers M4 through M6. The planar pattern conductor of the capacitor C18 provided on the base layer M5 opposes the planar pattern conductors provided on the base layers M4 and M6 in the z-axis direction. The planar pattern conductors of the capacitor C18 provided on the base layers M4 and M6 are connected to each other through via-conductors, and are also electrically connected to the output terminal $P_{out2}$ through wiring conductors. The planar pattern conductor provided on the base layer M5 is electrically connected to the ground terminal $P_{GND3}$ through via-conductors.

The inductor L13 is connected in parallel with the capacitor C18. More specifically, an outer electrode E133 of the inductor L13 is electrically connected to planar pattern conductors of the capacitor C18 on the base layers M4 and M6. An outer electrode E134 of the inductor L13 is electrically connected to the ground terminal $P_{GND3}$ through via-conductors and a planar pattern conductor of the capacitor C18 on the base layer M5.

As discussed above, as shown in FIGS. 4C and 4D, the ground conductors G4, G5, G6, and G7 are planar pattern conductors provided on the top surfaces of the base layers M12, M14, M16, and M18, respectively. The ground conductor G4 opposes, as a single unit, the planar pattern conductors of the capacitors C15 through C17 provided on the base layers M11 and M13 in the z-axis direction. The ground conductors G5 and G6 oppose in the z-axis direction the planar pattern conductors of the capacitors C14 through C17 provided on two adjacent base layers M in the z-axis direction. The ground conductor G7 opposes in the z-axis direction the planar pattern conductors of the capacitors C14 through C17 provided on the base layer M17. The ground conductors G5 through G7 are connected in series with each other in this order in the z-axis direction through via-conductors, and are also electrically connected to the ground terminal $P_{GND3}$ through via-conductors provided at both sides in the x-axis direction.

The output terminal $P_{out2}$ is provided on the second surface S2 of the base layer M19. More specifically, on the second surface S2, the output terminal $P_{out2}$ is provided at the end portion in the negative direction of the y axis and at substantially the center of the x-axis direction. The output terminal $P_{out2}$ is connected to the outer electrode E124 of the inductor L12 through via-conductors. On the second surface S2, the two ground terminals $P_{GND3}$ are provided in the positive direction and the negative direction of the x axis with the output terminal $P_{out2}$ therebetween. On the second surface S2, another ground terminal $P_{GND3}$ is provided at the end portion in the positive direction of the x axis and substantially at the center of the y-axis direction.

A non-limiting example of a manufacturing method for the above-described wave splitter 1 will now be described below. First, the multilayer body 3 is fabricated. More specifically, $Al_2O_3$, $CeO_3$, $Ba_2Ti_4O_{12}$, Ca—Al—B—Si glass powder are input into a ball mill as raw materials and are blended by a wet process, thus obtaining a mixture. The mixture is then dried and milled. Then, the obtained powder is calcined. The calcined powder is milled in a ball mill by a wet process and is then dried and cracked, thus producing ceramic powder. A dielectric material forming a multilayer body matrix is not particularly restricted, and plastics or dielectric ceramics may preferably be used, for example.

A binder, a plasticizer, a humectant, and a dispersant are added to the ceramic powder, and they are mixed in a ball mill. Then, the resulting mixture is degassed by decompression, thereby generating ceramic slurry. The ceramic slurry is then formed into sheets by a doctor blade process and is dried. As a result, ceramic green sheets which define the base materials M are obtained.

Then, through-holes used for via-conductors are formed in the ceramic green sheets by a laser or a punching press, for example, and an electrode paste made of a metal, such as copper, for example, as a principal component is filled into the through-holes. A desired number of such ceramic green sheets (in this preferred embodiment, 19 sheets forming the base layers M1 through M19, for example) are stacked on each other.

A conductive paste made of a metal, such as copper, for example, as a principal component is applied to one principal surface of each ceramic green sheet by using a screen printing or photolithographic process, for example, thus forming various electrodes and various pattern conductors.

A multilayer body matrix defined by the ceramic green sheets is subjected to pressure-bonding and is then fired. Then, the inductors L2 through L13 are mounted on the top surface of the multilayer body matrix. The multilayer body matrix is then diced into individual multilayer bodies 3. As a result, the wave splitter 1 is manufactured.

As described above, in the ground conductors G1 through G3, a current flows principally in the z-axis direction, and the distance between the ground conductors G1 through G3 and the ground terminals $P_{GND1}$ through $P_{GND3}$ in the z-axis direction is reduced to be as small as possible so as to decrease the length of a current path, thus significantly reducing or preventing the generation of inductance components in the ground conductors G1 through G3. Additionally, the base layer M10 preferably has a thickness of about 300 μm, for example, thus significantly reducing or preventing the generation of stray capacitance between one of the capacitors C1 through C4 and the ground conductor G1. Accordingly, it is possible to significantly reduce or prevent potential changes in the ground conductors G1 through G3. As a result, a sufficient attenuation (for example, about −70 dB or lower) is obtained in an attenuation pole near a pass band of the LPF 5 indicated by the solid curved lines in FIGS. 5A and 5B. Similar technical advantages are also obtained for the HPF 7.

Rebounding from an attenuation pole in the passband characteristics of the LPF 5 occurs due to the magnetic coupling between the inductors L2 and L3, and the amount of rebounding is determined by the degree of magnetic coupling therebetween. More specifically, as the strength of the magnetic coupling between the inductors L2 and L3 increases, a greater amount of rebounding from an attenuation pole occurs. In order to reduce the amount of magnetic coupling, in the wave splitter 1 or the LPF 5, the inductors L1 through L6 are provided on a series arm from the common input terminal $P_{in}$ to the output terminal $P_{out1}$. Among the inductors L1 through L6, the inductors L2 through L6 are mounted on the first surface S1 of the multilayer body 3. The winding axis A2 of the inductor L2 located closest to the common input terminal $P_{in}$ among the inductors L2 through L6 on a signal path of the input frequency multiplex signal is perpendicular or substantially perpendicular to winding axis of the inductor L3 located second closest to the common input terminal $P_{in}$ (see FIG. 3). With this arrangement, a magnetic flux generated in one of the inductors L2 and L3 does not pass through the entire winding of the other inductor (that is, from the first turn to the final turn of the winding), thus reducing the amount of magnetic coupling between the inductors L2 and L3. As a result, although the inductors L2 and L3 are arranged close to each other, the occurrence of rebounding from an attenuation pole is significantly reduced or prevented. As shown in FIGS. 5A and 5B, a greater attenuation is obtained in a wide band at a high frequency side than the attenuation of the attenuation pole which appears at about 90 MHz. Similar technical advantages are also obtained for the HPF 7.

As described above, in this preferred embodiment, the inductor L7 is disposed outside the multilayer body 3. The multilayer body 3 may be restricted in terms of the size, and thus, there may be limitations on the number of devices that can be mounted on the multilayer body 3. Due to the limitations on the number of devices, the characteristics (for example, the passband characteristics and the frequency position and the attenuation of an attenuation pole near a pass band) of the LPF 5 may not be able to satisfy the requirement specifications. In this preferred embodiment, a required number of devices are compensated for by providing the external inductor L7, thus improving the characteristics of the LPF 5. More specifically, the characteristics of the LPF 5 are generally determined by the values of the inductors L1 through L7 and the capacitors C1 through C8. The frequency position and the attenuation of an attenuation pole are adjusted by providing the inductor L7.

In the wave splitter 1 or the LPF 5, as shown in FIG. 2A, the suction area A to which suction is applied by a surface-mount device is defined at a predetermined position (in this preferred embodiment, substantially at the central portion) on the first surface S1, and the identification mark I is indicated at a predetermined position (in this preferred embodiment, at an end portion in the positive direction of the x axis) on the first surface S1. A combination of the suction area A and the identification mark I enables the surface-mount device to determine a correct suction position. Additionally, since the suction area A is defined on the first surface S1, it is not necessary to seal the inductors L2 through L13 with, for example, a resin, thus reducing the height of the wave splitter 1 or the LPF 5.

In the wave splitter 1 or the LPF 5, it is possible to increase the attenuation in the attenuation poles P1 and P2. More specifically, the attenuation poles P1 and P2 are defined by the parallel resonance circuits 52 and 51, respectively. If the magnetic coupling between the inductor L4 included in the parallel resonance circuit 52 and the inductor L3 included in the parallel resonance circuit 51 is increased, the attenuation in the attenuation poles P1 and P2 is decreased. Accordingly, in the wave splitter 1 or the LPF 5, the winding axis of the inductor L4 included in the parallel resonance circuit 52 having the lowest resonant frequency is perpendicular or substantially perpendicular to the winding axis of the inductor L3 included in the parallel resonance circuit 51 having the second lowest resonant frequency. With this arrangement, the amount of magnetic coupling between the inductors L3 and L4 is significantly decreased. As a result, a large attenuation is obtained in the attenuation poles P1 and P2.

In the wave splitter 1 or the LPF 5, it is possible to significantly reduce or prevent the occurrence of rebounding in the passband characteristics between the attenuation poles P1 and P3. More specifically, the attenuation pole P3 is defined by the parallel resonance circuit 53. If the magnetic coupling between the inductor L5 included in the parallel resonance circuit 53 and the inductor L4 included in the parallel resonance circuit 52 is decreased, the occurrence of rebounding is observed in the passband characteristics between the attenuation poles P2 and P3. Accordingly, in the wave splitter 1 or the LPF 5, the winding axis of the inductor L4 included in the parallel resonance circuit 52 having the lowest resonant frequency is parallel or substantially parallel with that of the inductor L5 included in the parallel resonance circuit 53 having the third lowest resonant frequency. With this arrangement, the magnetic coupling between the inductors L4 and L5 is significantly increased. As a result, it is possible to significantly reduce or prevent the occurrence of rebounding in the passband characteristics between the attenuation poles P2 and P3.

The inductors L2 through L5 and L8 through L13 are wound chip inductors and are mounted on the first surface S1 of the base layer M1 (that is, the multilayer body 3). By using wound chip inductors, it is easier to increase the L factor and the Q factor than using inductors provided within the multilayer body 3 as pattern conductors. Thus, it is possible to increase not only the Q factor of the LPF 5, but also the Q factor of the wave splitter 1. Since the L2 through L5 and L8 through L13 are surface-mounted inductors, they are easy to mount on the multilayer body 3.

On the series arm of each of the LPF 5 and the HPF 7, the inductor L1 is disposed immediately subsequent to the common input terminal $P_{in}$, thus increasing the impedance of each of the LPF 5 and the HPF 7. As a result, it is possible to significantly reduce or prevent the return loss of the wave splitter 1, in particular, the return loss in the pass band in the HPF 7.

In the wave splitter 1, at least the capacitors C1 through C18 are disposed in the multilayer body 3. The inclusion of the capacitors C1 through C18 may cause the generation of unwanted stray capacitance, which may further deteriorate high frequency characteristics. Accordingly, in this preferred embodiment, in the HPF 7, a phase adjusting circuit defined by the inductor L12, the capacitor C18, and the inductor L13 is inserted immediately prior to the output terminal $P_{out2}$. Thus, it is possible to significantly reduce or prevent a deterioration of the high frequency characteristics and also to perform impedance matching between the input impedance of the output terminal $P_{out2}$ and the output impedance of the inductor L12 while increasing the pass band of the HPF 7.

In the wave splitter 1, for example, the ground conductor G1 of the LPF 5, which is an example of a first ground conductor, and the ground conductor G5 of the HPF 7, which is an example of a second ground conductor, are separated from each other, although they are provided on the same base layer M14 (see FIG. 4C). If the LPF 5 and the HPF 7 use the same ground conductors, they interfere with each other. In order to avoid such interference, the ground conductors G1 through G3 of the LPF 5 and the ground conductors G4 through G6 of the HPF 7 are arranged so as to be separated from each other.

As seen from the foregoing description and FIGS. 4A through 4D, the ground conductors G1 through G3 are disposed closer to the ground terminals $P_{GND1}$ through $P_{GND3}$ provided on the second surface S2 of the multilayer body 3 than the capacitors C1 through C4. With this configuration, the distance between the ground conductors G1 through G3 and the ground terminals $P_{GND1}$ through $P_{GND3}$ is reduced, thus significantly reducing or preventing the generation of unwanted inductance components.

Figure 6:
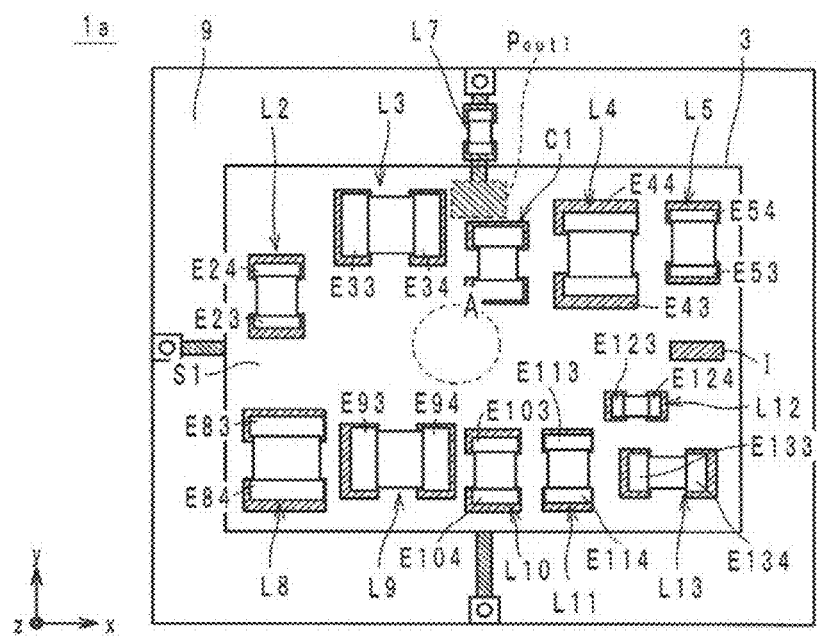
FIG. 6 is a top view of a wave splitter according to a first modified example of a preferred embodiment of the present invention.

A wave splitter 1a and an LPF 5a according to a first modified example of a preferred embodiment of the present invention will be described below with reference to FIG. 6.

The wave splitter 1a and the LPF 5a are different from the wave splitter 1 and the LPF 5 in that a capacitor C1 is a chip capacitor. More specifically, the capacitor C1 is mounted on the first surface S1 of the base layer M1 in the positive direction of the z axis (that is, on the top surface of the multilayer body 3). Additionally, the capacitor C1 is disposed between the two inductors L3 and L4, the winding axes of which are perpendicular or substantially perpendicular to each other.

In the wave splitter 1a or the LPF 5a, it is possible to more effectively significantly reduce or prevent the magnetic coupling between the inductors L3 and L4. Additionally, one of the electrodes of the capacitor C1 is connected to a ground. Thus, by disposing the capacitor C1 between the inductors L3 and L4, it is also possible to significantly reduce or prevent the electric-field coupling between the inductors L3 and L4.

In the wave splitter 1a and the LPF 5a, the capacitors C2 through C4 and C14 through C18 may be defined by chip capacitors. In this case, instead of the capacitor C1, one of the capacitors C2 through C4 and C14 through C18 may be disposed between the inductors L3 and L4.

Figure 7:
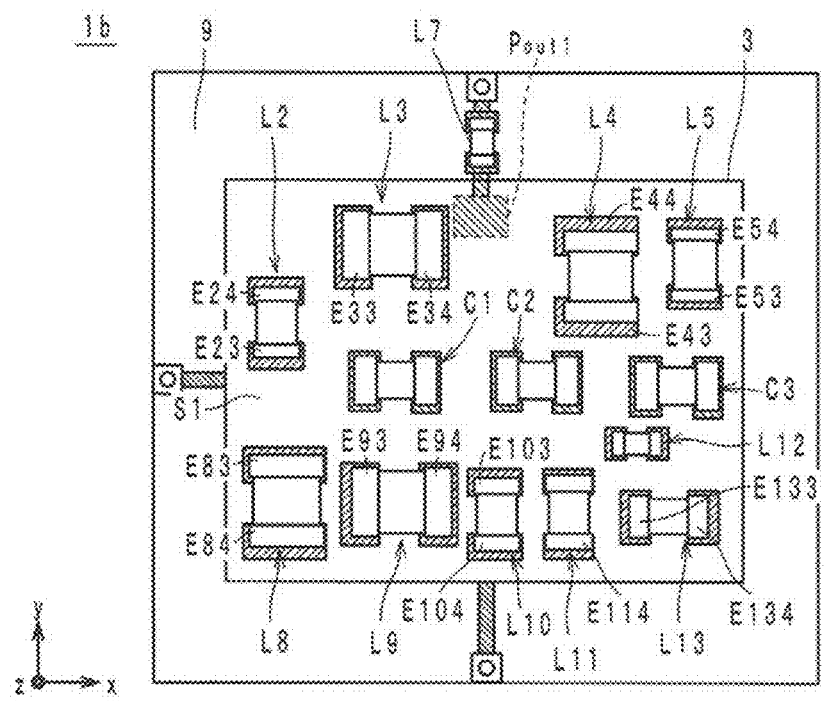
FIG. 7 is a top view of a wave splitter according to a second modified example of a preferred embodiment of the present invention.

A wave splitter 1b and an LPF 5b according to a second modified example of a preferred embodiment of the present invention will be described below with reference to FIG. 7.

The wave splitter 1b and the LPF 5b are different from the wave splitter 1 and the LPF 5 in that capacitors C1 through C3 are chip capacitors. More specifically, the capacitors C1 through C3 are mounted on the first surface S1 of the base layer M1 in the positive direction of the z axis (that is, on the top surface of the multilayer body 3). Additionally, the capacitors C1 through C3 are disposed between the inductors L3 through L5 included in the parallel resonance circuits 51 through 53, respectively, of the LPF 5 and the inductors L8 through L11 included in the series resonance circuits 71 through 74, respectively, of the HPF 7.

In the wave splitter 1b or the LPF 5b, it is possible to more effectively significantly reduce or prevent the magnetic coupling between the inductors L3 through L5 and the inductors L8 through L11.

In the wave splitter 1b and the LPF 5b, the capacitors C4 and C14 through C18 may be defined by chip capacitors. In this case, instead of the capacitors C1 through C3, some of the capacitors C4 and C14 through C18 may be disposed between the inductors L3 through L5 and the inductors L8 through L11.

The number of capacitors disposed between the inductors L3 through L5 and the inductors L8 through L11 is not restricted to three, and may be one, two, four, or more.

As shown in FIG. 3, a signal is transmitted from the outer electrode E23 to the outer electrode E24 in the inductor L2, and a signal is transmitted from the outer electrode E33 to the outer electrode E34 in the inductor L3. Alternatively, one of the inductors L2 and L3 may be rotated by 180° around the z axis on the first surface S1.

In the above-described preferred embodiments, the base layers M are preferably made of ceramics, such as LTCC, for example. However, the base layers M may be made of a resin.

In the above-described preferred embodiments, the inductors L2 through L5 and L8 through L13 are all horizontally wound chip inductors. However, concerning the inductors L2 and L3, the winding axes of which are perpendicular or substantially perpendicular to each other, one of the inductors may be a horizontally wound inductor, and the other one of the inductors may be a vertically wound inductor.

In the above-described preferred embodiments, the inductance and the size of the inductor L2 are different from those of the inductor L3. However, the inductor L3 may have the same or substantially the same inductance or the same or substantially the same size as that of the inductor L2, depending on the requirement specifications of the wave splitter 1.

In the above-described preferred embodiments, on the series arm, the inductor L2 is arranged prior to the parallel resonance circuit 51. However, the inductor L2 may be omitted depending on the requirement specifications of the wave splitter 1. In this case, another inductor, for example, the inductor L4, is arranged such that the winding axis of this inductor is perpendicular or substantially perpendicular to the winding axis A3 of the inductor L3.

The configurations of the wave splitters 1, 1a, and 1b and the configurations of the LPFs 5, 5a, and 5b may be combined with each other as desired.

The size of the LPF and the wave splitter according to various preferred embodiments of the present invention is significantly reduced and, thus, the LPF is suitably used in a wave splitter, a resonator, or a balun, and the wave splitter is suitably used in a resonator or a balun.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A low pass filter having an attenuation pole, comprising:
   a multilayer body including a first surface and a second surface;
   an input terminal, an output terminal, and a ground terminal provided on the second surface of the multilayer body;
   a plurality of parallel resonance circuits disposed on a series arm configured to connect the input terminal and the output terminal, each of the plurality of parallel resonance circuits including a capacitor and an inductor; and
   a capacitor disposed on a parallel arm configured to connect the series arm and the ground terminal; wherein
   at least two of the inductors disposed on the series arm are wound inductors mounted on the first surface of the multilayer body, and a winding axis of one of the at least two wound inductors is perpendicular or substantially perpendicular to a winding axis of another one of the at least two wound inductors;
   the multiplayer body is made of a low temperature co-fired ceramic; and
   at least one of the capacitors included in the plurality of parallel resonance circuits or the capacitor disposed on the parallel arm is provided within the multilayer body.

2. The low pass filter according to claim 1, wherein, among the wound inductors mounted on the first surface of the multilayer body, a winding axis of a wound inductor located closest to the input terminal is perpendicular or substantially perpendicular to a winding axis of a wound inductor located second closest to the input terminal on a path of a signal input into the input terminal.

3. The low pass filter according to claim 1, further comprising:
   an inductor that is disposed outside the multilayer body and that is electrically connected to the output terminal.

4. The low pass filter according to claim 1, wherein:
   a suction area to which suction is to be applied by a nozzle of a surface-mount device is defined at or substantially at a center of the first surface of the multilayer body; and
   the wound inductors are disposed outside the suction area on the first surface of the multilayer body.

5. The low pass filter according to claim 1, wherein a winding axis of a first wound inductor included in a first parallel resonance circuit having a lowest resonant frequency among the plurality of parallel resonance circuits is perpendicular or substantially perpendicular to a winding axis of a second wound inductor included in a second parallel resonance circuit having a second lowest resonant frequency among the plurality of parallel resonance circuits.

6. The low pass filter according to claim 5, wherein the winding axis of the first wound inductor included in the first parallel resonance circuit having the lowest resonant frequency among the plurality of parallel resonance circuits is parallel or substantially parallel with a winding axis of a third wound inductor included in a third parallel resonance circuit having a third lowest resonant frequency among the plurality of parallel resonance circuits.

7. The low pass filter according to claim 1, wherein:
   at least one of the capacitors included in the plurality of parallel resonance circuits is a chip capacitor mounted on the first surface of the multilayer body; and
   the chip capacitor is disposed between two of the wound inductors, a winding axis of one of the two wound inductors being perpendicular or substantially perpendicular to a winding axis of the other one of the two wound inductors.

8. A low pass filter having an attenuation pole, comprising:
   a multilayer body including a first surface and a second surface;
   an input terminal, an output terminal, and a ground terminal provided on the second surface of the multilayer body;
   at least one inductor disposed on a series arm configured to connect the input terminal and the output terminal;
   a plurality of parallel resonance circuits disposed on the series arm and arranged subsequent to the at least one inductor, each of the plurality of parallel resonance circuits including a capacitor and an inductor; and
   a capacitor disposed on a parallel arm configured to connect the series arm and the ground terminal; wherein at least two of the inductors disposed on the series arm are wound inductors mounted on the first surface of the multilayer body, and a winding axis of one of the wound inductors is perpendicular or substantially perpendicular to a winding axis of another one of the wound inductors;

the multiplayer body is made of a low temperature co-fired ceramic; and at least one of the capacitors included in the plurality of parallel resonance circuits or the capacitor disposed on the parallel arm is provided within the multilayer body.

9. The low pass filter according to claim 8, wherein, among the wound inductors mounted on the first surface of the multilayer body, a winding axis of a wound inductor located closest to the input terminal is perpendicular or substantially perpendicular to a winding axis of a wound inductor located second closest to the input terminal on a path of a signal input into the input terminal.

10. The low pass filter according to claim 8, wherein:
a suction area to which suction is to be applied by a nozzle of a surface-mount device is defined at or substantially at a center of the first surface of the multilayer body; and
the wound inductors are disposed outside the suction area on the first surface of the multilayer body.

11. The low pass filter according to claim 8, wherein a winding axis of a first wound inductor included in a first parallel resonance circuit having a lowest resonant frequency among the plurality of parallel resonance circuits is perpendicular or substantially perpendicular to a winding axis of a second wound inductor included in a second parallel resonance circuit having a second lowest resonant frequency among the plurality of parallel resonance circuits.

12. The low pass filter according to claim 11, wherein the winding axis of the first wound inductor included in the first parallel resonance circuit having the lowest resonant frequency among the plurality of parallel resonance circuits is parallel or substantially parallel with a winding axis of a third wound inductor included in a third parallel resonance circuit having a third lowest resonant frequency among the plurality of parallel resonance circuits.

13. The low pass filter according to claim 8, wherein:
at least one of the capacitors included in the plurality of parallel resonance circuits is a chip capacitor mounted on the first surface of the multilayer body; and
the chip capacitor is disposed between two of the wound inductors, a winding axis of one of the two wound inductors being perpendicular or substantially perpendicular to a winding axis of the other one of the two wound inductors.

14. A wave splitter comprising:
a multilayer body including a first surface and a second surface;
an input terminal, a first output terminal, and a first ground terminal provided on the second surface of the multilayer body;
a low pass filter having an attenuation pole disposed between the input terminal and the first output terminal on the multilayer body;
a second output terminal and a second ground terminal provided on the second surface of the multilayer body; and
a high pass filter disposed between the input terminal and the second output terminal on the multilayer body and that includes capacitors and inductors; wherein
the low pass filter includes:
a plurality of parallel resonance circuits disposed on a series arm configured to connect the input terminal and the first output terminal, each of the plurality of parallel resonance circuits including a capacitor and an inductor; and
a capacitor disposed on a parallel arm configured to connect the series arm and the first ground terminal;
at least two of the inductors disposed on the series arm are wound inductors mounted on the first surface of the multilayer body, and a winding axis of one of the wound inductors is perpendicular or substantially perpendicular to a winding axis of another one of the wound inductors;
the multiplayer body is made of a low temperature co-fired ceramic; and
at least one of the capacitors included in the plurality of parallel resonance circuits or the capacitor disposed on the parallel arm is provided within the multilayer body.

15. The wave splitter according to claim 14, wherein the high pass filter includes:
a plurality of capacitors disposed on a series arm configured to connect the input terminal and the second output terminal; and
a plurality of series resonance circuits disposed on a plurality of respective parallel arms configured to connect the series arm and the second ground terminal, each of the plurality of series resonance circuits including a capacitor and an inductor; and
at least two of the inductors disposed on the plurality of parallel arms are wound inductors mounted on the first surface of the multilayer body, and a winding axis of one of the wound inductors is perpendicular or substantially perpendicular to a winding axis of another one of the wound inductors.

16. The wave splitter according to claim 15, wherein:
at least one of the capacitors included in the plurality of parallel resonance circuits of the low pass filter or at least one of the capacitors included in the plurality of series resonance circuits of the high pass filter is a chip capacitor mounted on the first surface of the multilayer body; and
the chip capacitor is disposed between the wound inductors included in the plurality of parallel resonance circuits of the low pass filter and the wound inductors included in the plurality of series resonance circuits of the high pass filter.

17. The wave splitter according to claim 14, wherein:
a suction area to which suction is to be applied by a nozzle of a surface-mount device is defined at or substantially at a center of the first surface of the multilayer body; and
the wound inductors are disposed outside the suction area on the first surface of the multilayer body.

18. The wave splitter according to one of claim 14, wherein a winding axis of a first wound inductor included in a first parallel resonance circuit having the lowest resonant frequency among the plurality of parallel resonance circuits is perpendicular or substantially perpendicular to a winding axis of a second wound inductor included in a second parallel resonance circuit having the second lowest resonant frequency among the plurality of parallel resonance circuits.

19. The wave splitter according to claim 18, wherein the winding axis of the first wound inductor included in the first parallel resonance circuit having the lowest resonant frequency among the plurality of parallel resonance circuits is parallel or substantially parallel with a winding axis of a third wound inductor included in a third parallel resonance circuit having the third lowest resonant frequency among the plurality of parallel resonance circuits.

20. A wave splitter comprising:
a multilayer body including a first surface and a second surface;
an input terminal, a first output terminal, and a first ground terminal provided on the second surface of the multilayer body;
a low pass filter having an attenuation pole disposed between the input terminal and the first output terminal on the multilayer body;
a second output terminal and a second ground terminal provided on the second surface of the multilayer body; and
a high pass filter disposed between the input terminal and the second output terminal on the multilayer body and that includes capacitors and inductors; wherein
the low pass filter includes:
at least one inductor disposed on a series arm configured to connect the input terminal and the first output terminal;
a plurality of parallel resonance circuits disposed on the series arm, each of the plurality of parallel resonance circuits including a capacitor and an inductor; and
a capacitor disposed on a parallel arm configured to connect the series arm and the first ground terminal;
at least two of the inductors disposed on the series arm are wound inductors mounted on the first surface of the multilayer body, and a winding axis of one of the wound inductors is perpendicular or substantially perpendicular to a winding axis of another one of the wound inductors;
the multiplayer body is made of a low temperature co-fired ceramic; and
at least one of the capacitors included in the plurality of parallel resonance circuits or the capacitor disposed on the parallel arm is provided within the multilayer body.

* * * * *